United States Patent [19]
Chiaroni et al.

[11] Patent Number: 5,781,326
[45] Date of Patent: Jul. 14, 1998

[54] APPARATUS FOR SHAPING BINARY OPTICAL SIGNALS, AND USE THEREOF TO MODIFY SAID SIGNALS

[75] Inventors: Dominique Chiaroni, Antony; Michel Sotom, Paris; Dominique De Bouard, St Genevieve Des Bois, all of France

[73] Assignee: Alcatel Alsthom Compagnie Generale D'Electricite, Paris, France

[21] Appl. No.: 874,580

[22] Filed: Jun. 13, 1997

[30] Foreign Application Priority Data

Jun. 14, 1996 [FR] France .................. 96 07 421

[51] Int. Cl.$^6$ .................. G02B 26/00; H04B 10/02
[52] U.S. Cl. .................. 359/237; 359/176
[58] Field of Search .................. 359/176, 237, 359/238

[56] References Cited

U.S. PATENT DOCUMENTS

| | | | |
|---|---|---|---|
| 5,264,960 | 11/1993 | Glance . | |
| 5,349,593 | 9/1994 | Lomashevitch et al. | 372/50 |
| 5,369,520 | 11/1994 | Avramopoulos et al. | 359/176 |
| 5,471,335 | 11/1995 | Nitta | 359/179 |
| 5,594,583 | 1/1997 | Devaux | 359/184 |

OTHER PUBLICATIONS

C. Joergensen et al, "Wavelength Conversion by Optimized Monolithic Integrated Mach–Zehnder Interferometer", *IEEE Photonics Technology Letters*, Apr. 1996, IEEE, US, vol. 8, No. 4, ISSN 1041–1135 pp. 52–1523.

B. Mikkelsen et al, "Polarisation Insensitive Wavelength Conversion of 10 Gbit/s signals with SOAs in a Michelson Interferometer", *Electronics Letters*, 3 Feb. 1994, UK, vol. 30, No. 3, ISSN 0013–5194, pp. 260–261.

*Primary Examiner*—Mark Hellner
*Attorney, Agent, or Firm*—Sughrue, Mion, Zinn, Macpeak & Seas, PLLC

[57] ABSTRACT

To shape binary optical signals, the apparatus comprises a first stage for providing a modulating signal whose high levels are stabilized so as to depend little on fluctuations in the input signal. The signal is applied to a second stage including an interferometer structure designed to deliver an output signal that is the result of interference between first and second auxiliary waves, the interference being respectively constructive and destructive when the power of the modulating signal corresponds respectively to a first logic state and to a second logic state. The apparatus can be used to modify the input signal by deleting or inserting data. It can be used in optical data switching or transmission.

14 Claims, 4 Drawing Sheets

5,781,326

APPARATUS FOR SHAPING BINARY OPTICAL SIGNALS, AND USE THEREOF TO MODIFY SAID SIGNALS

The invention lies in the field of opto-electronic systems used for optical transmission or processing of optical digital data.

BACKGROUND OF THE INVENTION

In such systems, information is often in the form of binary data represented by pulses modulating a light carrier wave. A binary value is thus determined as a function of the amplitude (or power) level of the modulated light wave.

During transmission, the signal inevitably suffers degradation making it more difficult at receivers to detect the high and low levels of the received signal. In the amplitude domain, the quality of an optical signal is usually defined by two parameters: the signal-to-noise ratio and the extinction ratio. The signal-to-noise ratio is defined as the ratio of the optical power of the signal over the noise power in a wavelength band containing the wavelength of the signal carrier. The extinction ratio is defined as the ratio of powers corresponding respectively to high levels and to low levels of the signal.

An object of the invention is to propose apparatus that is completely optical, i.e. without opto-electrical conversion and vice versa, and which is capable of improving the quality of a binary optical signal, i.e. of increasing the extinction ratio while conserving as large a signal-to-noise ratio as possible. In other words, the apparatus must be capable of taking a modulated input signal of poor quality and of delivering an output signal in which the high levels are stabilized with constant optical power, in which the low levels are of practically zero power, and in which the signal-to-noise ratio is very high.

A conceivable solution for increasing the extinction ratio consists in using an interferometer structure, e.g. of the Mach-Zehnder type. The structure comprises two branches conveying two coherent waves that are coupled together to form the output signal. One of the branches includes a medium whose index varies as a function of the optical power it conveys, and an input signal is injected into said branch. Variations in the power of the input signal then modulate the index and the two waves can interfere destructively or constructively as a function of the power level of the input signal.

Such a structure does indeed make it possible to improve the extinction ratio, but it suffers from the drawback that the conditions for obtaining constructive and destructive interference are very constraining on the input signal, in particular with respect to its wavelength, and above all power level when in the high state. As a result, operation thereof is very sensitive to fluctuations in those parameters.

OBJECT AND BRIEF SUMMARY OF THE INVENTION

An object of the invention is to remedy the drawbacks of the prior apparatus. To this end, the invention provides an apparatus for shaping an input optical signal in the form of a first light wave modulated between low and high power levels, wherein the apparatus comprises:

a first stage for delivering a modulating optical signal as a function of said input signal, the modulating signal being in the form of a second light wave of determined wavelength and being modulated between first and second power levels, the high level of said first and second levels being stabilized so as to depend little on fluctuations of said low and high levels of the input signal; and a second stage comprising an interferometer structure coupled to said first stage to receive said modulating signal and designed to deliver an output signal that is the result of interference between first and second auxiliary waves, which interference is respectively constructive and destructive when the power of the modulating signal is respectively equal to said first and second levels.

Thus, the role of the first stage is to eliminate any fluctuations that may be present in the high levels of the modulating signal injected into the interferometer structure. This causes said structure to operate in stable manner. Also, the apparatus is independent of the value of or fluctuations in the wavelength of the input optical signal or in its polarization.

In a particular embodiment, said interferometer structure comprises first and second light guide branches respectively receiving first and second portions of a third light wave via coupling means, said branches being respectively provided with first and second semiconductor optical amplifiers, said first amplifier receiving said modulating signal via second coupling means, said first and second amplifiers being fed with electric currents adjusted to deliver said first and second auxiliary waves respectively.

Thus, in addition to the amplification effect provided by the semiconductor amplifiers, use is also made of their property of possessing an index that is a function both of the total optical power received and of the current injected into the active layer. This therefore makes it easy to adjust the operating point of the interferometer structure.

Advantageously, said first and second coupling means are disposed so that said first amplifier supplies said first auxiliary wave and receives said modulating signal in opposite propagation directions.

This disposition facilitates extraction of the output signal.

Also, the noise which accompanies the output signal is essentially due to the spontaneous amplified emission (ASE) produced by the semiconductor amplifiers of the interferometer structure. To attenuate the effects thereof on the output signal and according to another characteristic of the invention, said currents are adjusted so that the interference is destructive when said first levels are the high levels of the modulating signal.

In a preferred embodiment, said first stage includes a third semiconductor amplifier suitable for receiving said input signal and a fourth light wave. The third amplifier and/or said input signal are dimensioned to place said third amplifier in a gain-saturation state when the input signal is in the high state. The modulating signal is constituted by said fourth light wave amplified by said third amplifier.

Advantageously, said third amplifier is a gain-stabilized semiconductor optical amplifier. This disposition presents the advantage that the high level of the modulating signal remains constant even if the low level of the input signal is subject to large variations. This contributes to improving the operating stability of the interferometer structure.

The shaping apparatus of the invention can advantageously be used to modify received data. More precisely, it makes it possible to delete a portion of the data in a received signal or to insert new data therein. Deleting or inserting data can be useful, for example, in switching matrices which process data associated with a header containing routing information.

The invention thus also provides a method of modifying an input binary optical signal, wherein the method consists in applying said input signal to the shaping apparatus according to the invention, and in power modulating said auxiliary waves.

In a variant, the invention also provides for modifying the input binary optical signal by power modulating said fourth light wave or by modulating the electric current applied to said third amplifier. In particular, modulating the fourth light wave by an appropriate sampling signal makes it possible to perform both shaping and resynchronization of an input binary signal.

BRIEF DESCRIPTION OF THE DRAWINGS

Other aspects and advantages of the invention appear from the following description given with reference to the figures, in which.

MORE DETAILED DESCRIPTION

Figure 1:
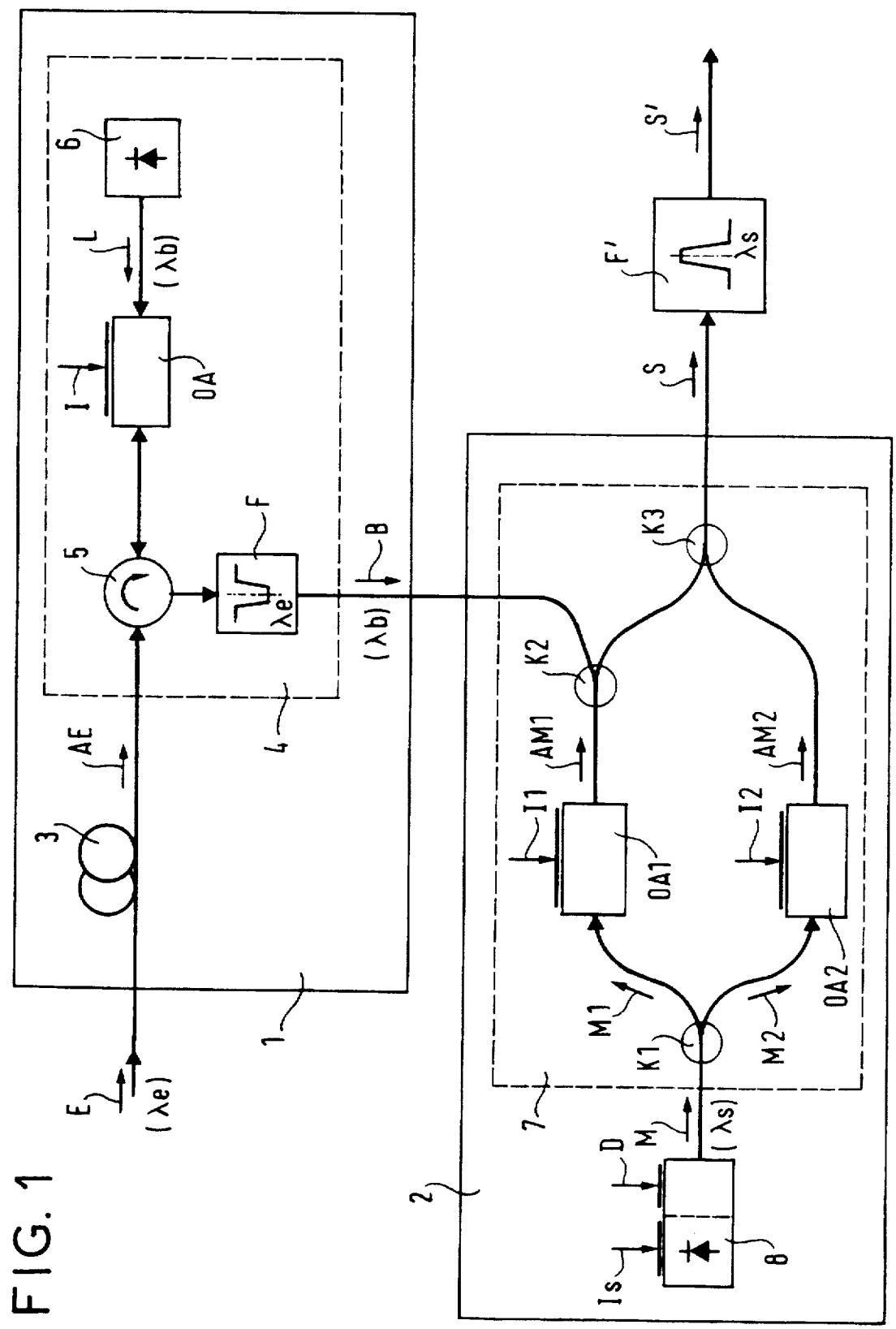
FIG. 1 is a schematic of a preferred embodiment of the apparatus of the invention.

The apparatus shown in FIG. 1 comprises a first stage 1 receiving an input binary output signal E that is to be shaped by the apparatus and delivering a modulating optical signal B to a second stage 2.

The first stage 1 comprises an optical fiber amplifier 3 receiving the input signal E and delivering an amplified input signal AE to a peak limiter 4. The peak limiter 4 comprises a semiconductor optical amplifier OA having a first face coupled to a laser oscillator 6 delivering an intermediate carrier wave L. The other face of the amplifier OA is connected to a circulator 5 having first and second ports provided respectively for receiving the amplified input signal AE from the fiber amplifier 3 and for injecting it into the amplifier OA. A third port of the circulator 5 delivers the modulating signal B via a notch filter F set to the wavelength $\lambda e$ of the input signal E. The wavelength $\lambda b$ of the intermediate wave L is selected to be different from that of the input signal E and is advantageously adjustable by using a wavelength tunable laser oscillator as the source 6.

Figure 5:
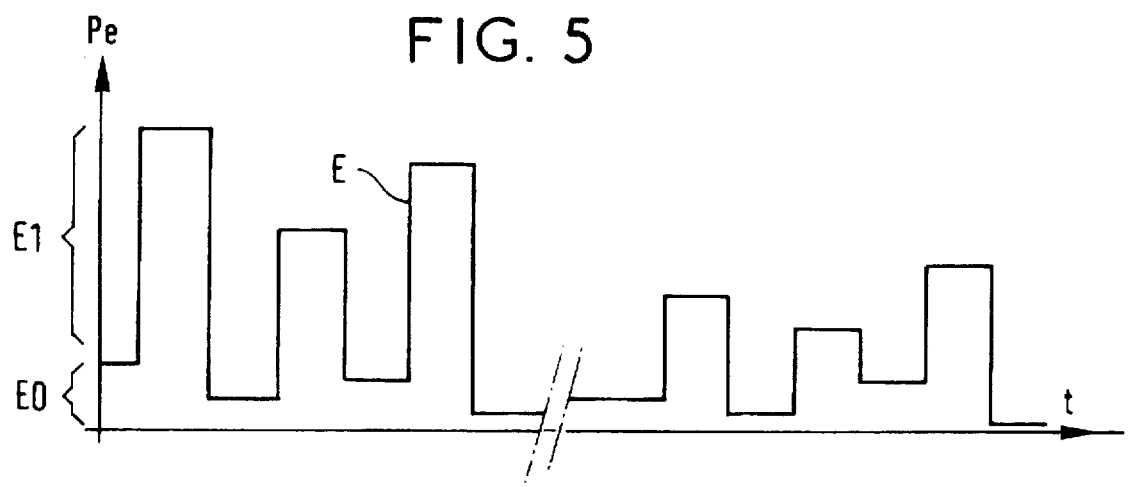
FIGS. 5 to 8 are timing diagrams showing transformations performed on binary optical signals by the apparatus of the invention.
Figure 6:
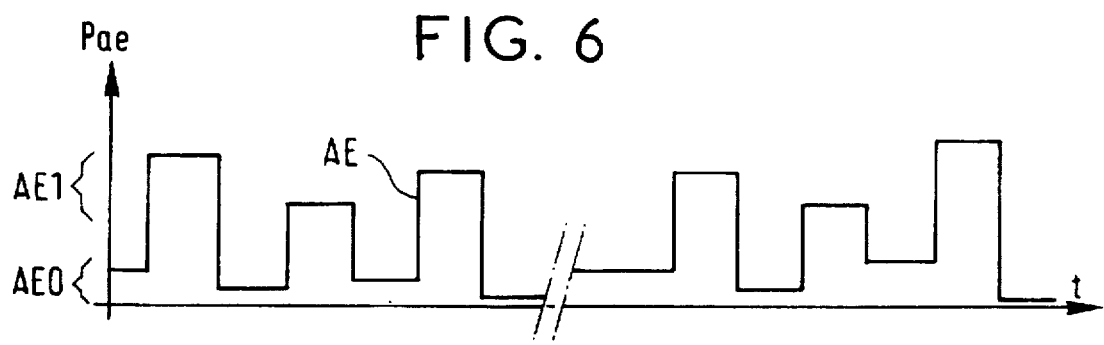

The operation of the first stage can be explained with the help of FIGS. 2, 5, 6, and 7. By way of example and in diagrammatic manner, FIG. 5 shows variations as a function of time in the optical power Pe of the input signal E. It is assumed that a first data train having high mean optical power is followed by a second data train at lower mean optical power. Also, the high levels E1 and the low levels E0 of the signal E are subject to large fluctuations. The fiber amplifier 3 is designed to operate in gain saturation mode. This results in the mean optical power of the amplified signal AE being equalized. FIG. 6 shows variations as a function of time in the optical power Pae of the amplified signal AE.

Figure 2:
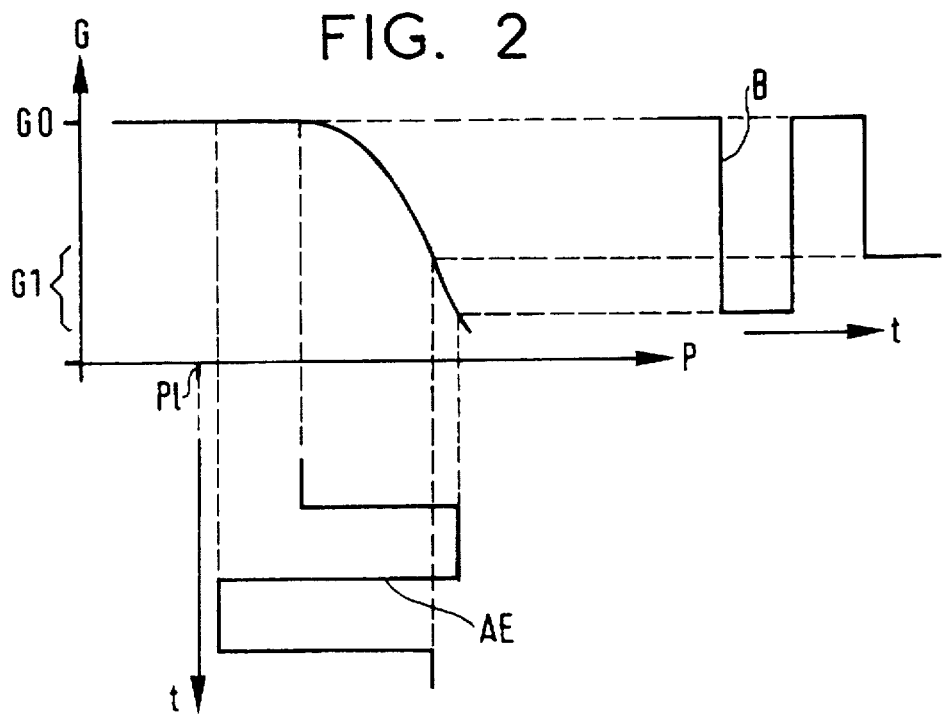
FIGS. 2 to 4 are graphs for explaining the principle on which the FIG. 1 apparatus operates.
Figure 7:
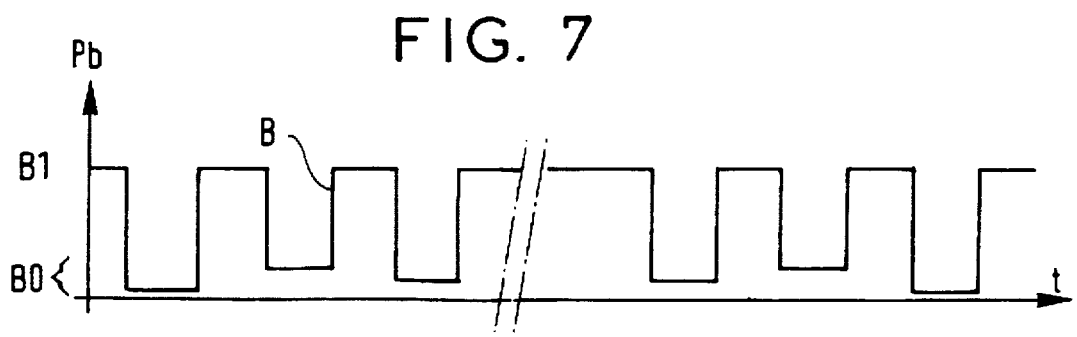

FIG. 2 shows diagrammatically how the gain G of the amplifier OA varies as a function of the total optical power P that it receives. For the peak limiter 4, the power P is the sum of the power Pl of the intermediate wave L and the power Pae of the amplified signal AE. The curve shown corresponds to an amplifier whose gain is stabilized, e.g. in accordance with the teaching of European patent application EP-A-630 876. Such an amplifier has the property of conserving constant gain over a wide range of variation in the optical power it receives. However, its gain falls off steeply when the power exceeds a threshold value characteristic of the selected amplifier. By appropriately dimensioning the fiber amplifier 3 and/or the semiconductor amplifier OA, the power modulation of the amplified input signal AE is capable of modulating the gain G between a constant high value G0 and low values G1. This gain modulation applies to the auxiliary wave L whose power Pl is constant. As a result, the amplifier OA delivers to the circulator 5 a power-modulated wave whose high levels are practically independent of fluctuations in the low level of the input signal E. Thus, the modulating signal B obtained after optional filtering F also has this property, as shown in FIG. 7.

The second stage 2 of the FIG. 1 apparatus includes an interferometer structure 7 made up of two light-guiding branches provided with respective semiconductor optical amplifiers OA1 and OA2. A first coupler K1 serves to couple one end of each of these branches to a laser source 8 delivering an output carrier wave M of wavelength $\lambda s$. A second coupler K2 is disposed to enable the modulating signal B to be injected into the first amplifier OA1. A third coupler K3 connected to the coupler K2 and to the second amplifier OA2 is disposed so as to deliver an output signal S that is the result of coupling together auxiliary waves AM1 and AM2 delivered by the amplifiers OA1 and OA2 respectively. The waves AM1 and AM2 correspond to the waves M1 and M2 coming from the coupler K1 and amplified by the amplifiers OA1 and OA2 respectively.

Currents I1 and I2 are injected respectively into the amplifiers OA1 and OA2. In a first option, these currents are adjusted so that the output signal S is the result of constructive interference between the waves AM1 and AM2 when the power of the modulating signal B is low, and is the result of destructive interference otherwise. This case is shown in FIG. 3 which shows the output power Ps of the signal S as a function of the power Pb of the modulating signal B when the current I2 has the value I20.

Figure 4:
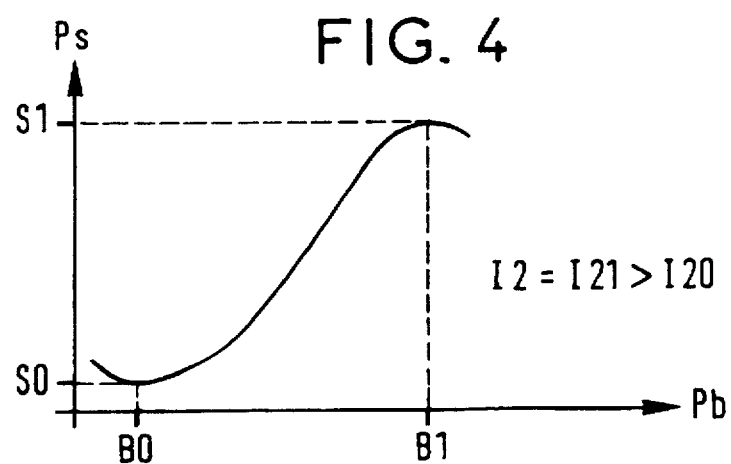

In another option, the current I2 can be adjusted to a value I21 greater than I20 to obtain a response from the interferometer structure 7 as shown in FIG. 4. In this case, the interference is destructive when the power of the signal B is low and constructive when it is high.

Figure 3:
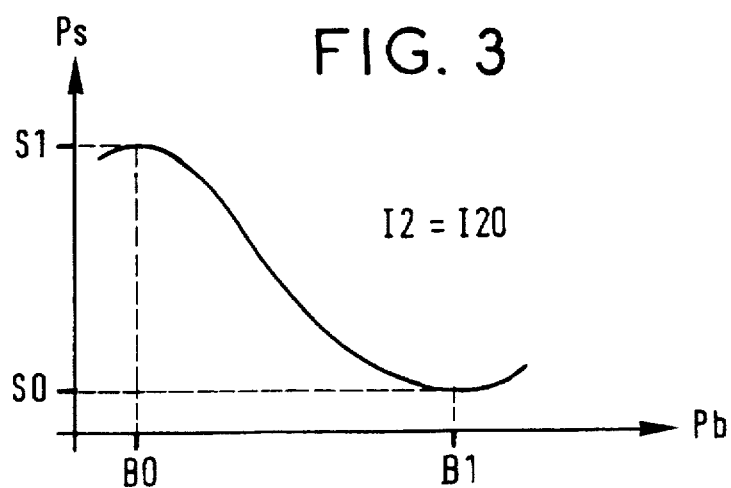
Figure 8:
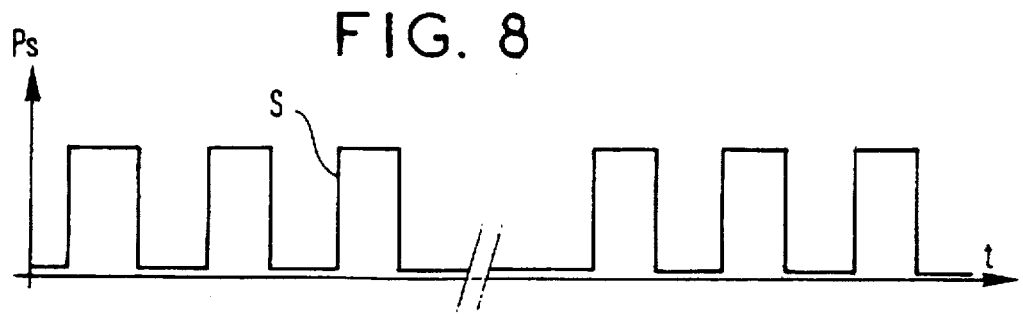

Thus, when using a response as shown in FIG. 3, variation of the power Ps of the output signal as a function of time is as shown in FIG. 8. The assembly can be finished off with an output filter F' set pass to the wavelength $\lambda s$ so as to eliminate amplified spontaneous emission produced by the amplifiers OA1 and OA2.

The assembly as described above thus makes it possible to provide excellent shaping of the input signal while accepting large fluctuations in its high and low levels. The particular role of the first stage is to stabilize the operation of the interferometer structure 7 in the second stage 2, while the role of the interferometer structure is to regenerate the extinction ratio degraded by the first stage.

When the source 6 is suitable in wavelength, it is advantageous to select a wavelength $\lambda b$ which provides maximum gain to the amplifier OA1 for the selected injection current I1.

For example, when using the response shown in FIG. 3, it is possible to select the currents I1 and I2 as follows. A high current I1 is applied, e.g. 200 mA, with a signal B of zero power, and a search is made for the value I20 of the current I2 which leads to maximum power Ps for the output signal S1. Thereafter, while retaining the same currents, a search is made for the power B1 of the injected signal B which leads to minimum power Ps for the output S0. Finally, a search is made for the value of current I that is to be injected into the amplifier OA of the peak limiter 4 such that the high power level of the signal B is equal to the previously determined value B1.

To modify the input signal using the above-described apparatus, it is appropriate to provide means enabling the power of the auxiliary waves AM1 and AM2 to be modulated. For this purpose, it is possible for the source 8 to be a laser having an integrated modulator, for example. A current Is is then injected into the laser portion while a modulating voltage D is applied in inverted form to the modulating portion. With such apparatus, it is possible to delete input data by zeroing the optical power of the wave M delivered by the modulator. For the case in which the interference is destructive for the signal B in the high state, it is possible to insert data when the signal B is in the low state by modulating the power of the wave M by modulating the voltage D. For the case in which the interference is constructive for the signal B in the high state, it is possible to insert data when said signal is in the high state by modulating the power of the signal M as before.

The input signal can also be modified by modulating the power Pt, e.g. by means of a modulator placed between the source 6 and the amplifier OA. This option can advantageously be used for resynchronizing a synchronous input signal E, i.e. for eliminating any jitter that might affect it. For example, when the input signal is of the NRZ type, this can be done merely by modulating the power Pt by means of a sampling clock signal (not shown in the figure) constituted by pulses of width narrower than the bit time of the input signal, of frequency equal to the bit frequency, and set approximately on the middles of the bit time intervals of the signal. If the duration of the pulses is equal to half the bit time of the input signal, it is possible to obtain an output signal of the RZ type.

In contrast, if it is desired to deliver an output signal S that is of the NRZ type, it is possible merely by adjusting the currents I1 and I2 to ensure that the passband of the amplifier OA1, and thus of the second stage 2, has a cutoff frequency lying between the bit frequency and half said frequency.

It is also possible to delete parts of the signal by modulating the current I fed to the amplifier OA.

Figure 9:
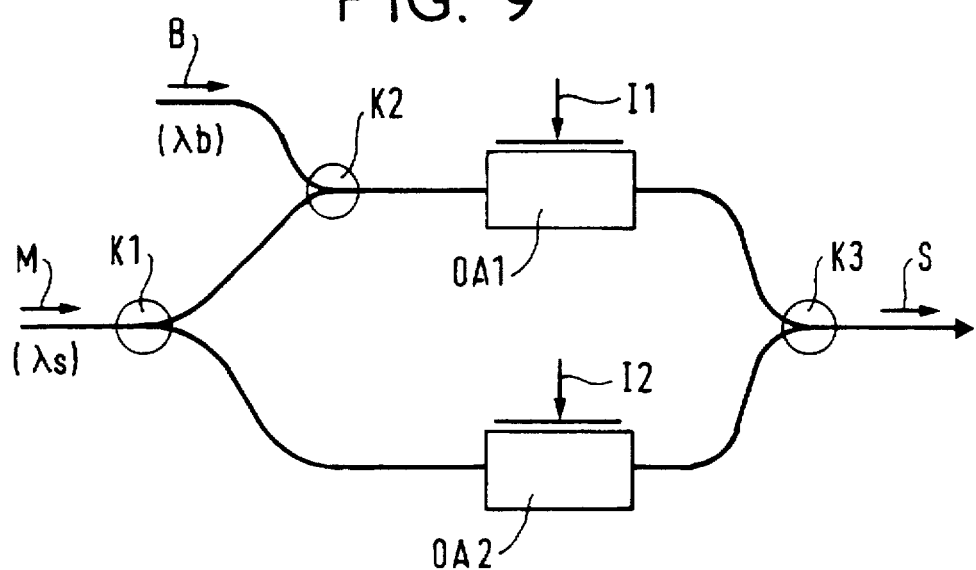
FIGS. 9 and 10 show variant embodiments of the interferometer structure forming a portion of the apparatus of the invention.

FIG. 9 shows a variant embodiment of the interferometer structure 7. The structure is still of the Mach-Zehnder type but the modulating signal B and the wave M are injected into the first amplifier OA1 with the same propagation direction. Operation is analogous to that of the structure shown in FIG. 1 with the exception that an output filter F' capable of effectively stopping the wavelength λb must be placed at the output of the apparatus.

Figure 10:
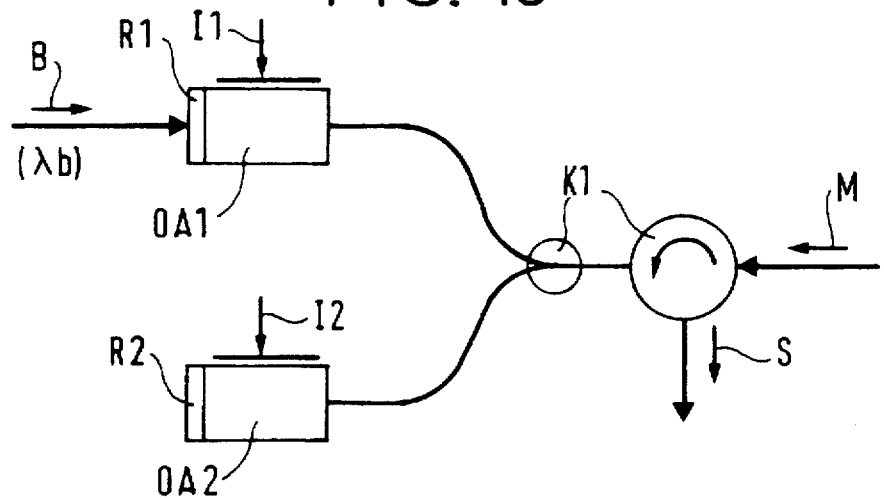

FIG. 10 shows another structure, equivalent to the above structure but of the Michelson type. In this variant, the two amplifiers OA1 and OA2 are coupled together at one end only, with their opposite faces being provided with respective reflective coatings R1 and R2. The modulating signal is injected into the first amplifier OA1 via its face R1 and the wave M is injected into both amplifiers OA1 and OA2 via their faces opposite to R1 and R2 via an assembly K1 formed by a circulator associated with a coupler. A first port of the circulator receives the wave M, the second port is coupled to the two amplifiers OA1 and OA2, and a third port delivers the output signal S.

Figure 11:
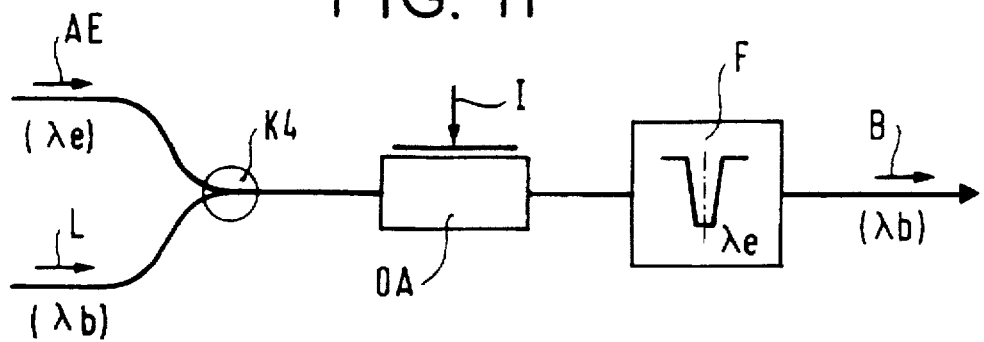
FIG. 11 shows a variant embodiment of the first stage of the apparatus of the invention.

FIG. 11 shows a variant embodiment of the peak limiter 4. It operates on a principle analogous to that of the apparatus shown in FIG. 1 with the exception that the wave L and the amplified input signal AE are injected into the amplifier OA in the same propagation direction. It is then necessary to provide a stop filter F that is capable of effectively eliminating the wavelength λe of the input signal.

It may be observed that in the embodiment of the peak limiter 4 shown in FIG. 1, it is possible to eliminate the filter F by providing antireflection treatment on the faces of the amplifier OA. Under such circumstances, it is easy to integrate all three amplifiers OA, OA1, and OA2 in a single component, providing the circulator 5 is replaced by a simple coupler.

We claim:

1. Apparatus for shaping an input optical signal in the form of a first light wave modulated between low and high power levels, wherein the apparatus comprises:

a first stage for delivering a modulating optical signal as a function of said input signal, the modulating signal being in the form of a second light wave of determined wavelength and being modulated between first and second power levels, the high level of said first and second levels being stabilized so as to be substantially independent of fluctuations of said low and high levels of the input signal; and a second stage comprising an interferometer structure coupled to said first stage to receive said modulating signal and deliver an output signal that is the result of constructive interference between first and second auxiliary waves when the power of the modulating signal is equal to said first power level and the result of destructive interference between said first and second auxiliary waves when the power of the modulating signal is equal to said second level.

2. Apparatus according to claim 1, wherein said interferometer structure comprises first and second light guide branches respectively receiving first and second portions of a third light wave via first coupling means, said branches being respectively provided with first and second semiconductor optical amplifiers, said first amplifier receiving said modulating signal via second coupling means, said first and second amplifiers being fed with electric currents adjusted to deliver said first and second auxiliary waves, respectively.

3. Apparatus according to claim 2, wherein said first and second coupling means are disposed so that said first amplifier supplies said first auxiliary wave and receives said modulating signal in opposite propagation directions.

4. Apparatus according to claim 2, wherein said currents are adjusted so that the interference is destructive when said first levels are the high levels of the modulating signal.

5. Apparatus according to claim 1, wherein said first stage includes a semiconductor amplifier suitable for receiving said input signal and a further light wave, wherein said amplifier and/or said input signal are dimensioned to place said amplifier in a gain-saturation state when the input signal is in the high state, and wherein said modulating signal is constituted by said further light wave amplified by said amplifier.

6. Apparatus according to claim 5, wherein said amplifier is a gain-stabilized semiconductor optical amplifier.

7. Apparatus according to claim 5, wherein the further wave has a wavelength which ensures maximum gain for said first amplifier.

8. Apparatus according to claim 5, wherein said first stage includes an optical fiber amplifier suitable for operating in gain saturation mode and disposed so as to amplify said input signal prior to applying it to said amplifier.

9. A method of modifying an input binary optical signal in the form of a first light wave modulated between low and high power levels, said method comprising the steps of:

applying said input signal to a shaping apparatus comprising: a first stage for delivering a modulating optical signal as a function of said input signal, the modulating signal being in the form of a second light wave of determined wavelength and being modulated between first and second power levels, the high level of said first and second levels being stabilized so as to be substantially independent of fluctuations of said low and high levels of the input signal; and a second stage comprising an interferometer structure coupled to said first stage to receive said modulating signal and deliver an output signal that is the result of constructive interference between first and second auxiliary waves when the power of the modulating signal is equal to said first power level and the result of destructive interference between said first and second auxiliary waves when the power of the modulating signal is equal to said second level; and power modulating said auxiliary waves.

10. A method of modifying an input binary optical signal in the form of a first light wave modulated between low and high power levels, said method comprising the steps of:

applying said input signal to a shaping apparatus comprising: a first stage for delivering a modulating optical signal as a function of said input signal, the modulating signal being in the form of a second light wave of determined wavelength and being modulated between first and second power levels, the high level of said first and second levels being stabilized so as to be substantially independent of fluctuations of said low and high levels of the input signal; and a second stage comprising an interferometer structure coupled to said first stage to receive said modulating signal and deliver an output signal that is the result of constructive interference between first and second auxiliary waves when the power of the modulating signal is equal to said first power level and the result of destructive interference between said first and second auxiliary waves when the power of the modulating signal is equal to said second level, said interferometer structure comprising first and second light guide branches respectively receiving first and second portions of a third light wave via first coupling means, said branches being respectively provided with first and second semiconductor optical amplifiers, said first amplifier receiving said modulating signal via second coupling means, said first and second amplifiers being fed with electric currents adjusted to deliver said first and second auxiliary waves, respectively; and power modulating said third light wave.

11. A method of modifying an input binary optical signal in the form of a first light wave modulated between low and high power levels, said method comprising the steps of:

applying said input signal to a shaping apparatus comprising: a first stage for delivering a modulating optical signal as a function of said input signal, the modulating signal being in the form of a second light wave of determined wavelength and being modulated between first and second power levels, the high level of said first and second levels being stabilized so as to be substantially independent of fluctuations of said low and high levels of the input signal, said first stage including a semiconductor amplifier suitable for receiving said input signal and a further light wave, wherein said amplifier and/or said input signal are dimensioned to place said amplifier in a gain-saturation state when the input signal is in the high state, and wherein said modulating signal is constituted by said further light wave amplified by said amplifier; and a second stage comprising an interferometer structure coupled to said first stage to receive said modulating signal and deliver an output signal that is the result of constructive interference between first and second auxiliary waves when the power of the modulating signal is equal to said first power level and the result of destructive interference between said first and second auxiliary waves when the power of the modulating signal is equal to said second level; and power modulating said further light wave.

12. A method according to claim 11, wherein said further light wave is modulated by a sampling clock signal constituted by pulses of width narrower than the bit time of the input signal, of frequency equal to that of the input signal, and set approximately to the middles of the bit time intervals of the input signal.

13. A method according to claim 12, wherein said second stage is designed to have a cutoff frequency lying between the bit frequency of the input signal and half said frequency.

14. A method of modifying an input binary optical signal in the form of a first light wave modulated between low and high power levels, said method comprising the steps of:

applying said input signal to a shaping apparatus comprising: a first stage for delivering a modulating optical signal as a function of said input signal, the modulating signal being in the form of a second light wave of determined wavelength and being modulated between first and second power levels, the high level of said first and second levels being stabilized so as to be substantially independent of fluctuations of said low and high levels of the input signal, said first stage including a semiconductor amplifier suitable for receiving said input signal and a further light wave, wherein said amplifier and/or said input signal are dimensioned to place said amplifier in a gain-saturation state when the input signal is in the high state, and wherein said modulating signal is constituted by said further light wave amplified by said amplifier; and a second stage comprising an interferometer structure coupled to said first stage to receive said modulating signal and deliver an output signal that is the result of constructive interference between first and second auxiliary waves when the power of the modulating signal is equal to said first power level and the result of destructive interference between said first and second auxiliary waves when the power of the modulating signal is equal to said second level; and modulating the electric current applied to said amplifier.

* * * * *